(12) United States Patent
Ikeda et al.

(10) Patent No.: US 11,309,273 B2
(45) Date of Patent: Apr. 19, 2022

(54) ELECTRONIC MODULE

(71) Applicant: SHINDENGEN ELECTRIC MANUFACTURING CO., LTD., Tokyo (JP)

(72) Inventors: Kosuke Ikeda, Hanno (JP); Osamu Matsuzaki, Hanno (JP)

(73) Assignee: SHINDENGEN ELECTRIC MANUFACTURING CO., LTD., Tokyo (JP)

(*) Notice: Subject to any disclaimer, the term of this patent is extended or adjusted under 35 U.S.C. 154(b) by 885 days.

(21) Appl. No.: 16/060,279

(22) PCT Filed: May 19, 2017

(86) PCT No.: PCT/JP2017/018835
§ 371 (c)(1),
(2) Date: Jun. 7, 2018

(87) PCT Pub. No.: WO2018/211686
PCT Pub. Date: Nov. 22, 2018

(65) Prior Publication Data
US 2021/0175198 A1 Jun. 10, 2021

(51) Int. Cl.
*H01L 23/00* (2006.01)
*H01L 23/495* (2006.01)
*H01L 25/07* (2006.01)

(52) U.S. Cl.
CPC ........ *H01L 24/40* (2013.01); *H01L 23/49517* (2013.01); *H01L 23/49537* (2013.01);
(Continued)

(58) Field of Classification Search
CPC ............ H01L 25/074; H01L 23/49575; H01L 2924/3511; H01L 2224/401–40499;
(Continued)

(56) References Cited

U.S. PATENT DOCUMENTS

2005/0224945 A1   10/2005   Saito et al.
2007/0228534 A1   10/2007   Uno et al.
(Continued)

FOREIGN PATENT DOCUMENTS

JP   2005302951 A   10/2005
JP   2014045157 A    3/2014
(Continued)

OTHER PUBLICATIONS

Netherlands, Appln. No. 2020929, Search Report, dated Jan. 16, 2019.
(Continued)

*Primary Examiner* — Amar Movva
(74) *Attorney, Agent, or Firm* — Ladas & Parry, LLP

(57) ABSTRACT

An electronic module has a first substrate 11, a first electronic element 13 provided on one side of the first substrate 11, a first connection body 60 provided on one side of the first electronic element 13, a second electronic element 23 provided on one side of the first connection body 60, a second substrate 21 provided on one side of the second electronic element 23, and an abutment body 250 that abuts on a face on one side of the second electronic element 23 and is capable of imparting a force toward one side with respect to the second substrate 21.

5 Claims, 14 Drawing Sheets

(52) U.S. Cl.
CPC .. *H01L 23/49568* (2013.01); *H01L 23/49575* (2013.01); *H01L 24/32* (2013.01); *H01L 24/33* (2013.01); *H01L 25/074* (2013.01); *H01L 23/49562* (2013.01); *H01L 2224/32245* (2013.01); *H01L 2224/33181* (2013.01); *H01L 2224/404* (2013.01); *H01L 2224/40095* (2013.01); *H01L 2224/40105* (2013.01); *H01L 2224/40247* (2013.01); *H01L 2224/73213* (2013.01); *H01L 2224/73263* (2013.01); *H01L 2924/13055* (2013.01); *H01L 2924/13091* (2013.01); *H01L 2924/3511* (2013.01); *H01L 2924/3512* (2013.01)

(58) Field of Classification Search
CPC ......... H01L 2224/321–32268; H01L 2224/72; H01L 2224/90
See application file for complete search history.

(56) References Cited

U.S. PATENT DOCUMENTS

| | | | |
|---|---|---|---|
| 2009/0127676 A1 | 5/2009 | Gomez | |
| 2012/0063107 A1 | 3/2012 | Krishnan et al. | |
| 2012/0074516 A1 | 3/2012 | Yamaguchi et al. | |
| 2013/0277811 A1* | 10/2013 | Pruitt | H01L 23/492 257/666 |
| 2014/0264804 A1* | 9/2014 | Terrill | H01L 24/34 257/676 |
| 2015/0340350 A1 | 11/2015 | Koga | |
| 2016/0365299 A1 | 12/2016 | Koga | |

FOREIGN PATENT DOCUMENTS

| | | |
|---|---|---|
| JP | 2015220429 A | 12/2015 |
| JP | 2016066700 A | 4/2016 |
| WO | 2012096066 A1 | 7/2012 |
| WO | 2012109265 A2 | 8/2012 |

OTHER PUBLICATIONS

Office Action from TW app. No. 107115219, dated Jul. 24, 2019, with machine English translation from Google Translate.
International Search Report for PCT/IP2017/018835, dated Aug. 1, 2017, and its English translation provided by Google Translate.
Written Opinion for PCT/IP2017/018835, dated Aug. 1, 2017, and its English translation provided by Google Translate.

* cited by examiner

ELECTRONIC MODULE

CROSS-REFERENCE TO RELATED APPLICATION

The present application is the U.S. national phase of PCT Application PCT/JP2017/018835 filed on May 19, 2017, the disclosure of which is incorporated herein by reference in its entirety.

TECHNICAL FIELD

The present invention relates to an electronic module having a plurality of electronic elements.

BACKGROUND ART

An electronic module in which a plurality of electronic elements are provided in a sealing resin has been conventionally known (for example, see Japanese Patent Application Laid-open No. 2014-45157). It is desired to downsize such an electronic module.

As one means for downsizing, it is conceivable to employ an aspect in which electronic elements are stacked in layers. In such a case, it is conceivable to provide another electronic element (second electronic element) on one side (for example, on the front side) of an electronic element (first electronic element).

According to such an aspect, the first substrate on the first electronic element side and the second substrate on the second electronic element side sometimes become larger as the number of electronic elements is increased due to wiring routing. When the sizes of the first substrate and the second substrate become large in this manner, the first substrate and the second substrate are sometimes warped or distorted in a heat treatment process such as a soldering process and a reflowing process. It is conceivable to provide a post or the like between the first substrate and the second substrate in order to prevent such warpage or distortion, but the number of parts increases according to such an aspect.

SUMMARY OF INVENTION

Technical Problem

The present invention provides an electronic module that can prevent warpage or distortion of a first substrate or a second substrate without increasing the number of parts.

Solution to Problem

An electronic module according to the present invention may comprise:
a first substrate;
a first electronic element provided on one side of the first substrate;
a first connection body provided on one side of the first electronic element;
a second electronic element provided on one side of the first connection body;
a second substrate provided on one side of the second electronic element; and
an abutment body that abuts on a face on one side of the second electronic element and is capable of imparting a force toward one side with respect to the second substrate,
wherein the abutment body may electrically connect the second electronic element and a terminal part which is connectable to an external device.

The electronic module according to the present invention may further comprise:
a first conductor layer provided between the first substrate and the first electronic element; and
a second conductor layer provided on the other side of the second substrate, wherein
the abutment body may have a first abutment body, and
the first abutment body may have an abutment proximal end part that abuts on a face on one side of the second electronic element, a second-substrate-side abutment part that extends from the abutment proximal end part toward one side and abuts on the second conductor layer or the second substrate, and a first-substrate-side abutment part that extends from the second-substrate-side abutment part to the other side and abuts on the first conductor layer or the first substrate.

In the electronic module according to the present invention,
the first substrate may be a metal substrate,
the second substrate may be a metal substrate,
the abutment body may have a first abutment body, and
the first abutment body may have an abutment proximal end part that abuts on a face on one side of the second electronic element, a second-substrate-side abutment part that extends from the abutment proximal end part toward one side and abuts on the second substrate, and a first-substrate-side abutment part that extends from the second-substrate-side abutment part to the other side and abuts on the first substrate.

In the electronic module according to the present invention,
the second-substrate-side abutment part may have a first convex part protruding to one side, and
the second-substrate-side abutment part may abut on the second conductor layer via conductive adhesive.

In the electronic module according to the present invention,
the first abutment body may have one or more leg parts extending to the other side and
the leg part may abut on the first conductor layer or the first substrate.

In the electronic module according to the present invention,
area where the leg part abuts on the first conductor layer or the first substrate may be smaller than area of the first-substrate-side abutment part abuts on the first conductor layer or the first substrate.

In the electronic module according to the present invention,
the abutment body may have a second abutment body, and
the second abutment body may have a first abutting member abutting on a face on one side of the second electronic element, a second abutting member provided on one side of the first abutting member, and a connecting member that connects the first abutting member and the second abutting member and can impart a force toward one side with respect to the second abutting member.

Advantageous Effects of Invention

As one aspect of the present invention, when adopting an abutment body that abuts on a face on one side of a second electronic element and can impart a force toward one side with respect to a second substrate, the abutment body electrically connecting the second electronic element and a terminal which is Connectable to an external device, warpage or distortion of a first substrate or the second substrate can be prevented without increasing the number of parts.

DESCRIPTION OF EMBODIMENTS

First Embodiment

<<Configuration>>

Figure 1:
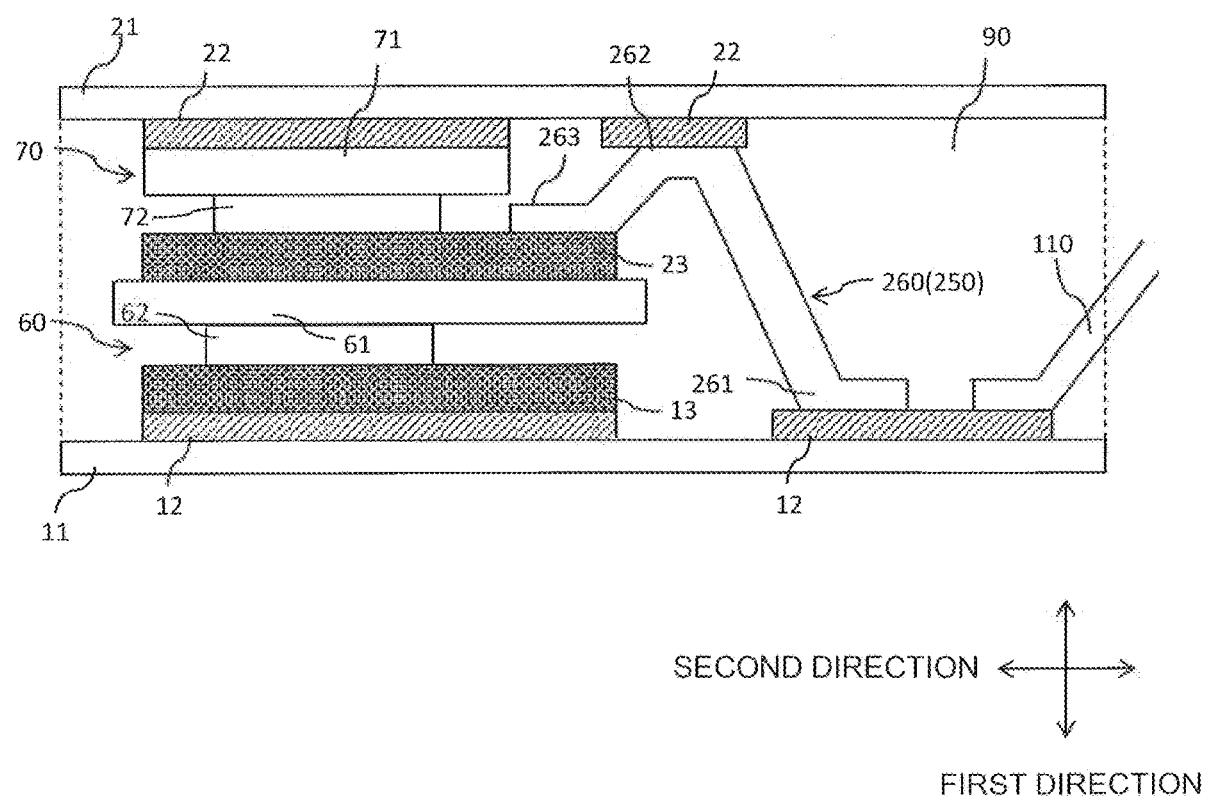
FIG. 1 is a longitudinal sectional view of an electronic module that can be used in a first embodiment of the present invention.

In the present embodiment, "one side" means the upper side in FIG. 1, and the "other side" means the lower side in FIG. 1. The vertical direction in FIG. 1 is referred to as a "first direction", the left-and-right direction is referred to as a "second direction", and the front-and-back direction of the paper is referred to as a "third direction". The in-plane direction including the second direction and the third direction is referred to as a "plane direction", and the case of being viewed from the upper side of FIG. 1 is referred to as a "plan view".

An electronic module of the present embodiment may have a first electronic unit and a second electronic unit.

As illustrated in FIG. 1, the first electronic unit may have a first substrate 11, a plurality of first conductor layers 12 provided on one side of the first substrate 11, and a first electronic element 13 provided on one side of the first conductor layer 12. The first electronic element 13 may be a switching element or a control element. When the first electronic element 13 is the switching element, the first electronic element 13 may be a MOSFET, an IGBT, or the like. Each of the first electronic element 13 and a second electronic element 23 to be described later may be configured using a semiconductor element, and a semiconductor material may be silicon, silicon carbide, gallium nitride, or the like. A face on the other side of the first electronic element 13 may be connected to the first conductor layer 12 via a conductive adhesive 5 (see FIG. 4 or the like) such as solder. Incidentally, the conductive adhesive 5 is not illustrated in FIGS. 1, 11, and the like in order to simplify the display.

A first connection body 60 may be provided on one side of the first electronic element 13. The first connection body 60 may be connected to a face on one side of the first electronic element 13 via the conductive adhesive 5 such as solder.

As illustrated in FIG. 1, a second electronic unit may be provided on one side of the first connection body 60. The second electronic unit may have the second electronic element 23 provided on one side of the first connection body 60. The second electronic unit may have a second substrate 21 and a second conductor layer 22 provided on the other side of the second substrate 21. A second connection body 70 may be provided on the other side of the second conductor layer 22. When the second conductor layer 22 is provided, the second electronic element 23 may be provided in the second conductor layer 22, which is different from the aspect illustrated in FIG. 1. The second connection body 70 may be connected to a face on one side of the second electronic element 23 and a face on the other side of the second conductor layer 22 via a conductive adhesive such as solder.

The second electronic element 23 may be a switching element or a control element. When the second electronic element 23 is the switching element, the second electronic element 23 may be a MOSFET, an IGBT, or the like.

The first connection body 60 may have a first head part 61 and a first pillar part 62 extending from the first head part 61 to the other side. The second connection body 70 may have a second head part 71 and a second pillar part 72 extending from the second head part 71 to the other side. A cross section of the first connection body 60 is a substantially T-shape, and a cross section of the second connection body 70 may also be a substantially T-shape.

An abutment body 250 that abuts on a face on one side of the second electronic element 23 and can impart a force toward one side with respect to the second substrate 21 may be provided. Incidentally, the "abutment" in the present application includes not only an aspect of direct abutment but also an aspect of indirect abutment. Examples of the aspect of indirect abutment can include an aspect of abutment via the conductive adhesive 5 such as solder. Only the single abutment body 250 may be provided, but a plurality of abutment bodies 250 may be provided.

As illustrated in FIG. 1, the abutment body 250 has a first abutment body 260 in the present embodiment. The first abutment body 260 may have a second-substrate-side abutment part 262 that abuts on the second conductor layer 22 or the second substrate 21 and a first-substrate-side abutment part 261 that extends from the second-substrate-side abutment part 262 to the other side and abuts on the first conductor layer 12 or the first substrate 11. More specifically, the first abutment body 260 may have an abutment proximal end part 263 that abuts on a face on one side of the second electronic element 23, and the second-substrate-side abutment part 262 that extends from the abutment proximal end part 263 toward one side in a direction inclined with respect to the plane direction and abuts on the second conductor layer 22 or the second substrate 21, and the first-substrate-side abutment part 261 that extends from the second-substrate-side abutment part 262 to the other side in the direction inclined with respect to the plane direction and abuts on the first conductor layer 12 or the first substrate 11. The abutment proximal end part 263 may be connected to a terminal (for example, a second gate terminal 23g to be described later) of the second electronic element 23 via the conductive adhesive 5 or the like.

As an example, the second-substrate-side abutment part 262 may abut on the second conductor layer 22, and the first-substrate-side abutment part 261 may abut on the first conductor layer 12. The second conductor layer 22 abutting on the second-substrate-side abutment part 262 may not perform an electrical function without being electrically connected to the other second conductor layer 22, the first conductor layer 12, the first electronic element 13, and the second electronic element 23.

The electronic module may have a sealing part 90 (see FIG. 1) configured using a sealing resin or the like that seals the first electronic element 13, the second electronic element 23, the first connection body 60, the second connection body 70, the first abutment body 260, a connector 85 to be described later (see FIG. 13), the first conductor layer 12, and the second conductor layer 22. The first conductor layer 12 abutting on the first-substrate-side abutment part 261 may protrude outward from the sealing part 90 and be connected to a terminal part 110 connectable to an external device.

Figure 2:
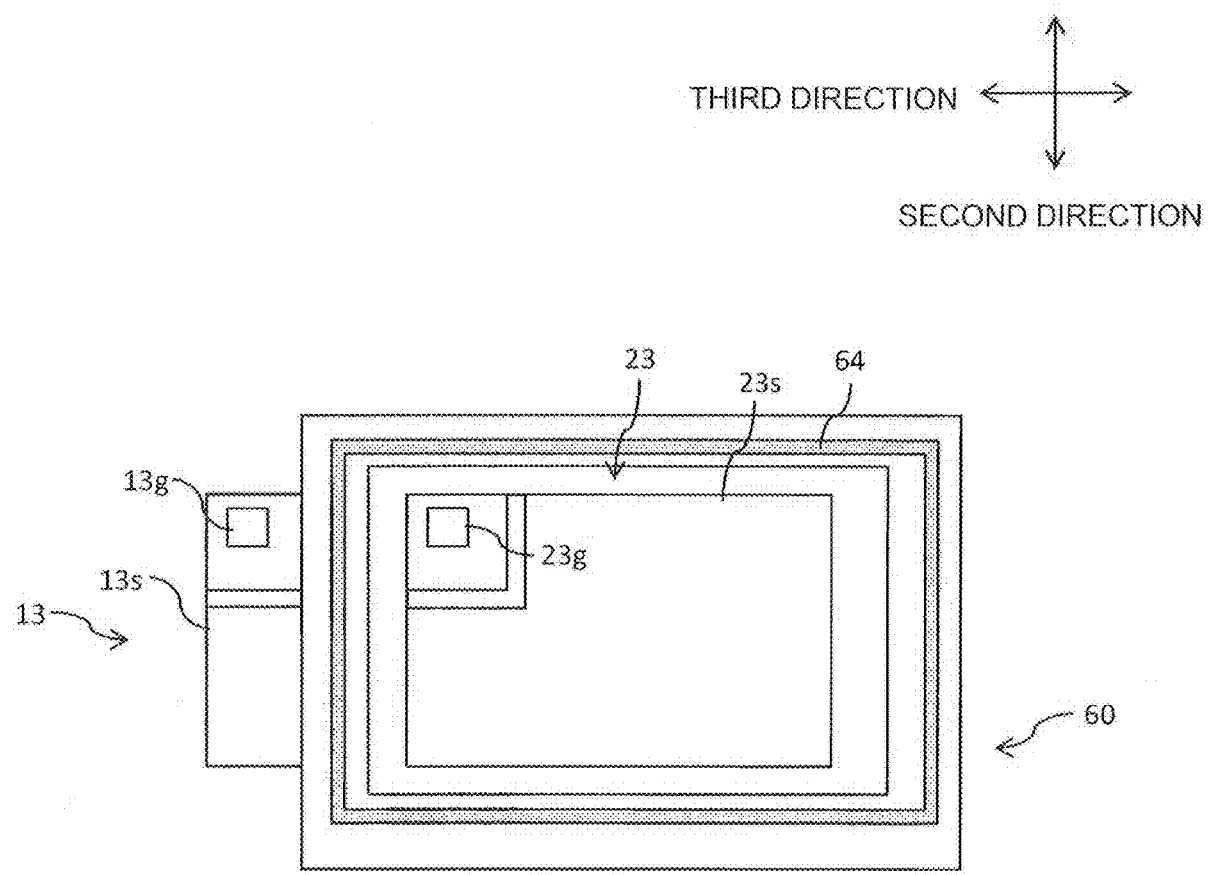
FIG. 2 is a plan view of an electronic module that can be used in the first embodiment of the present invention.
Figure 3:
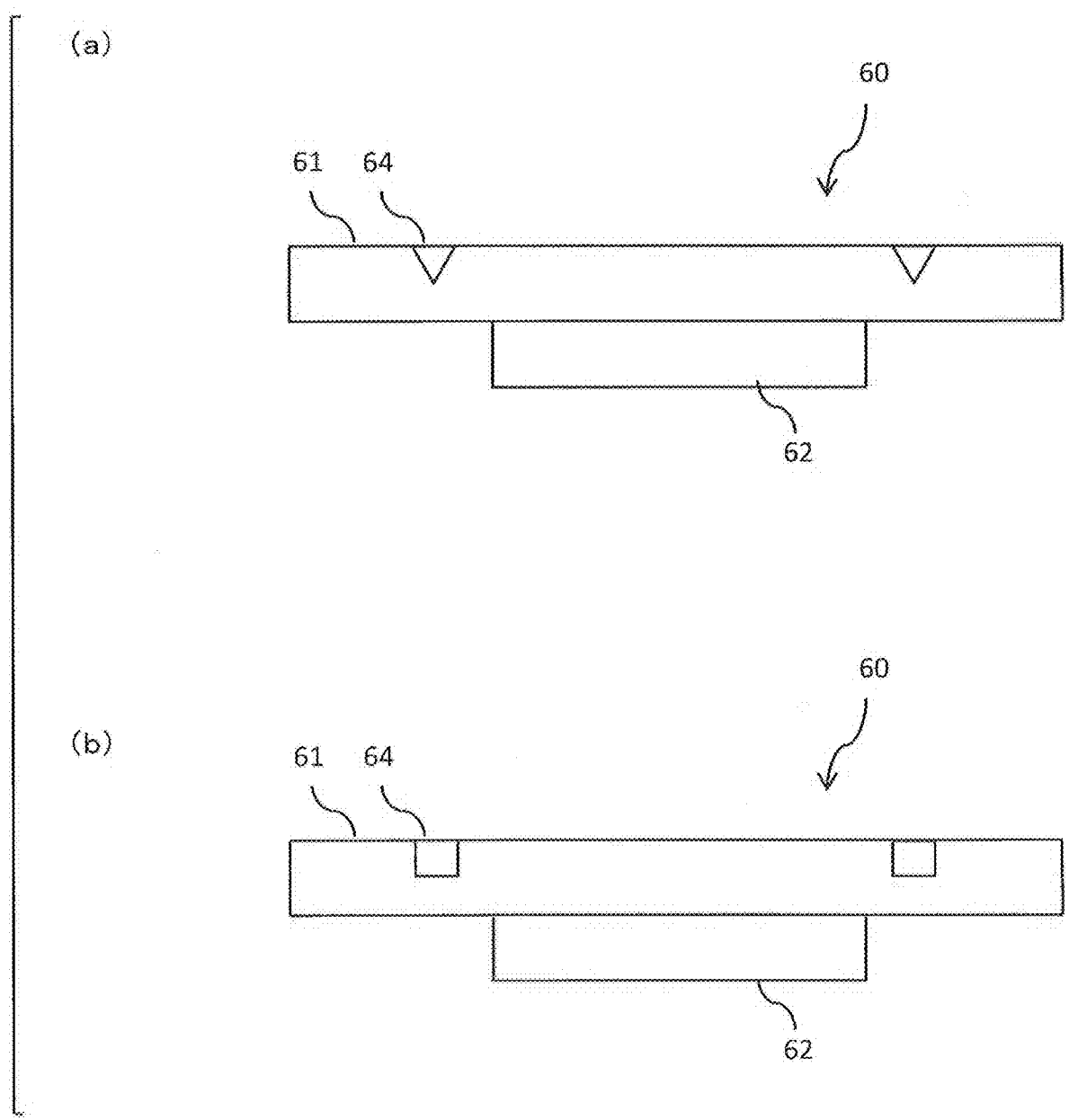
FIG. 3(a) is a longitudinal sectional view of a first connection body that can be used in the first embodiment of the present invention.
FIG. 3(b) is a longitudinal sectional view of another first connection body that can be used in the first embodiment of the present invention.

As illustrated in FIG. 2, a first groove part 64 may be provided on a face on one side of the first head part 61. The first groove part 64 is provided on the outer side of a circumference of the first pillar part 62 in a plan view (plane direction), but may be provided partially on the outer side of the circumference or on the outer side of the entire circumference of the first pillar part 62. The conductive adhesive 5 such as solder may be provided on a face of one side of the first head part 61 on the inner side of a circumference of the first groove part, and the second electronic element 23 may be provided via the conductive adhesive 5. A cross section of the first groove part 64 may be a rectangular shape as illustrated in FIG. 3(b) or may be a triangular shape as illustrated in FIG. 3(a). The triangular shape may be a right-angled triangle or an isosceles triangle.

As illustrated in FIG. 2, an aspect in which the first electronic element 13 is exposed to the outside from the first head part 61 in a plan view may be provided. When the first electronic element 13 is the switching element such as the MOSFET, a first gate terminal 13g or the like may be provided in a part exposed from the outside. Similarly, when the second electronic element 23 is the switching element such as the MOSFET, a second gate terminal 23g or the like may be provided on the face on one side thereof. The first electronic element 13 illustrated in FIG. 2 has the first gate terminal 13g and a first source terminal 13s on the face on one side thereof, and the second electronic element 23 has the second gate terminal 23q and a second source terminal 23s on the face on one side thereof. In this case, the second connection body 70 may be connected to the second source terminal 23s of the second electronic element 23 via the conductive adhesive, and the first abutment body 260 may be connected to the second gate terminal 23g of the second electronic element 23 via the conductive adhesive. In addition, the first connection body 60 may connect the first source terminal 13s of the first electronic element 13 and a second drain terminal provided on the other side of the second electronic element 23 via a conductive adhesive. A first drain terminal provided on the other side of the first electronic element 13 may be connected to the first conductor layer 12 via a conductive adhesive. The first gate terminal 13g of the first electronic element 13 may be connected to the connector 85 (see FIG. 13) via a conductive adhesive, and the connector 85 may be connected to the first conductor layer 12 via a conductive adhesive.

When only one of the first electronic element 13 and the second electronic element 23 is the switching element, it is also conceivable that the second electronic element 23 to be placed on the first connection body 60 is used as a control element with a low heat-generating property and the first electronic element 13 is used as the switching element. Conversely, it is also conceivable that the second electronic element 23 to be placed on the first connection body 60 is used as the switching element and the first electronic element 13 is used as the control element with the low heat-generating property.

In addition, a chip module may be configured of the first electronic element 13, the second electronic element 23, the first connection body 60, the second connection body 70, the first abutment body 260, and the connector 85. In this case, the electronic module may be manufactured by arranging the chip module, which has the first electronic element 13, the second electronic element 23, the first connection body 60, the second connection body 70, the first abutment body 260, and the connector 85, between the first substrate 11 having the first conductor layer 12 and the second substrate 21 having the second conductor layer 22, and then, sealing the chip module with the sealing part 90.

A ceramic substrate, an insulating resin layer, or the like can be employed as the first substrate 11 and the second substrate 21. A material containing Ag or Cu as a main component can be used as the conductive adhesive 5 other than solder. Metal such as Cu can be used as a material of the first connection body 60 and the second connection body 70. Incidentally, a metal substrate subjected to circuit patterning, for example, can be used as the substrates 11 and 21, and in this case, the substrates 11 and 21 also serve as the conductor layers 12 and 22.

Incidentally, bonding between the terminal part 110 and the conductor layers 12 and 22 is not limited to the aspect of using the conductive adhesive 5 such as solder, and laser welding or ultrasonic bonding may be used.

A first abutment body 170 does not need to adopt an electrically meaningful aspect and can also adopt an aspect in which the second conductor layer 22 on which a first abutting member 172 abuts is not electrically connected to the other second conductor layer 22, the first conductor layer 12, the first electronic element 13, and the second electronic element 23 not to perform an electrical function.

<<Operation and Effect>>

Next, an example of an operation and an effect according to the present embodiment having the above-described configuration will be described. Incidentally, all the aspects described in the "operation and effect" can be employed in the above-described configuration.

When adopting the aspect in which the abutment body 250 that abuts on the face on one side of the second electronic element 23 and can impart the force toward one side with respect to the second substrate 21 is provided, the second substrate 21 can be prevented from bending toward the other side. In particular, when a large number of chip modules are arranged and the first substrate 11 and the second substrate 21 are increased in the plane direction, there is a possibility that the first substrate 11 and the second substrate 21 are warped or distorted as heat is applied thereto. In this respect, generation of such a problem can be prevented by providing the abutment body 250 as in the present embodiment. Incidentally, such an effect is also exhibited in the abutment body 250 according to another embodiment to be described later.

As illustrated in FIG. 1, when using the first abutment body 260 that has the abutment proximal end part 263 abutting on the face on one side of the second electronic element 23, the second-substrate-side abutment part 262 extending from the abutment proximal end part 263 toward one side and abutting on the second conductor layer 22 or the second substrate 21, and the first-substrate-side abutment part 261 extending from the second-substrate-side abutment part 262 toward the other side and abutting on the first conductor layer 12 or the first substrate 11, it is advantageous in terms that a force toward one side can be imparted with respect to the second substrate 21 while receiving supported from the first substrate 11 side using the abutment proximal end part 263 and the first-substrate-side abutment part 261.

According to this aspect, since the second-substrate-side abutment part 262 is provided between the abutment proximal end part 263 and the first-substrate-side abutment part 261 in the plane direction, it is advantageous in terms that the force can be imparted to one side while supporting the second-substrate-side abutment part 262 from both sides of the abutment proximal end part 263 and the first-substrate-side abutment part 261.

When adopting the aspect in which the abutment proximal end part 263 abuts on the second electronic element 23 via the conductive adhesive 5 or the like, the second-substrate-side abutment part 262 abuts on the second conductor layer 22 via the conductive adhesive 5 or the like, and the first-substrate-side abutment part 261 abuts on the first conductor layer 12 via the conductive adhesive 5 or the like, a positional shift of the first abutment body 260 can be prevented by the conductive adhesive 5. In particular, although the force to warp or distort the first substrate 11 and the second substrate 21 is applied as the heat is applied, it is advantageous in terms that the positional shift of the first abutment body 260 can be prevented at this time.

In addition, when adopting the aspect in which the second conductor layer 22 abutting on the second-substrate-side abutment part 262 is not electrically connected to the other second conductor layer 22, the first conductor layer 12, the first electronic element 13, and the second electronic element 23 not to perform the electrical function, it is advantageous in terms that the first electronic element 13 and the second electronic element 23 can be prevented from exhibiting unexpected behavior due to erroneous conduction of the second-substrate-side abutment part 262 of the first abutment body 260.

When adopting the aspect in which the first abutment body 260 electrically connects the terminal (for example, the second gate terminal 23g) of the second electronic element 23 and the terminal part 110 connectable to the external device to perform a function as a connector, it is advantageous in terms that the first abutment body 260 can also be used as a connector for connecting the second electronic element 23 and the terminal part 110 and the first substrate 11 and the second substrate 21 can be prevented from being warped or distorted without increasing the number of parts.

Second Embodiment

Next, a second embodiment of the present invention will be described.

Figure 4:
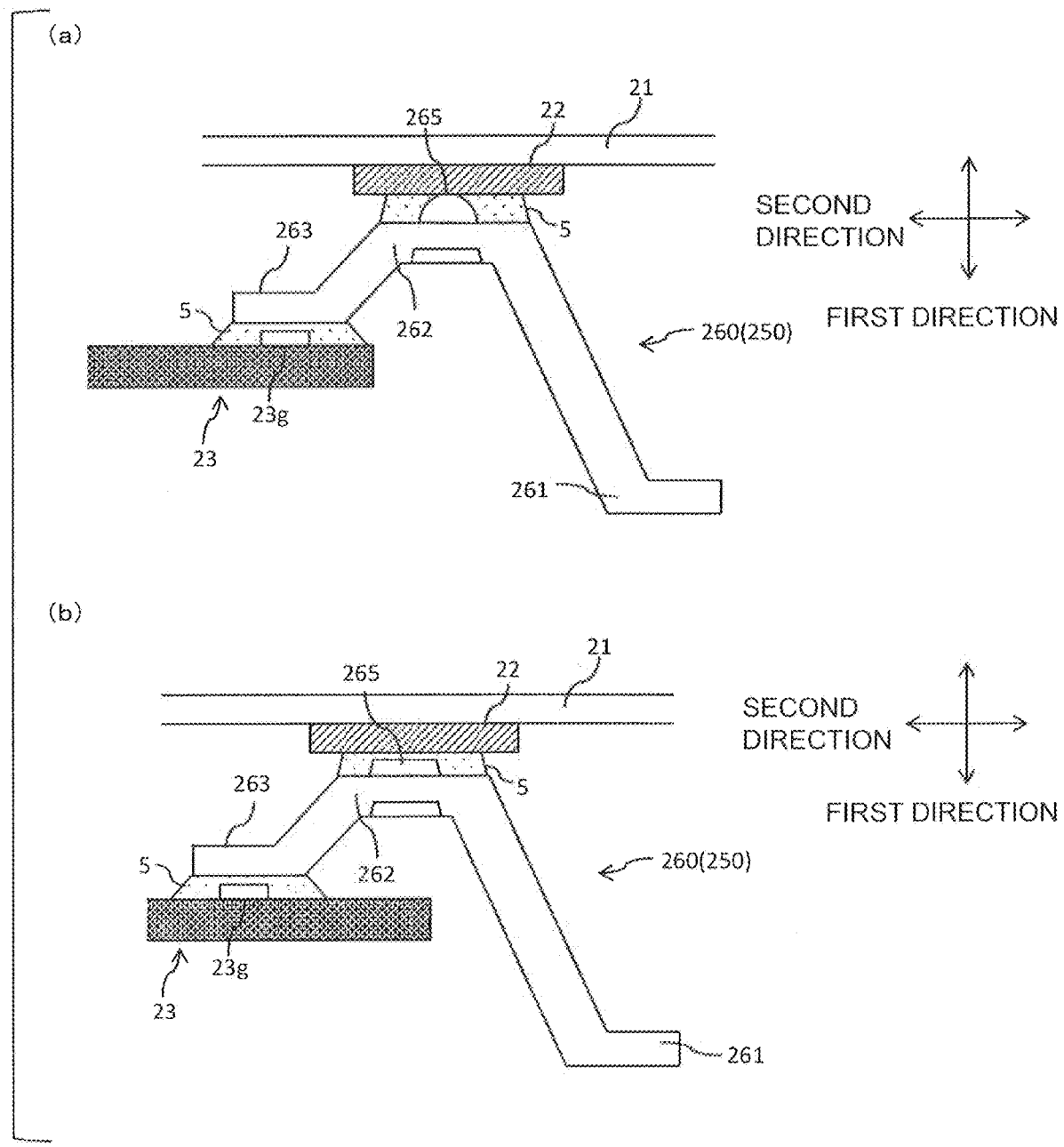
FIG. 4(a) is a longitudinal sectional view of a first abutment body that can be used in a second embodiment of the present invention.
FIG. 4(b) is a longitudinal sectional view of another first abutment body that can be used in the second embodiment of the present invention.

The present embodiment is configured as an aspect in which a first convex part 265 protruding to one side is provided on the second-substrate-side abutment part 262, and the second-substrate-side abutment part 262 abuts on the second conductor layer 22 via the conductive adhesive 5 as illustrated in FIG. 4. The other configurations are the same as those in the first embodiment, and all the aspects that have been described in the first embodiment can be adopted. The members that have been described in the first embodiment will be described using the same reference signs.

When the first convex part 265 is provided on the second-substrate-side abutment part 262 as in the present embodiment, the conductive adhesive 5 provided between the second conductor layer 22 and the second-substrate-side abutment part 262 can be caused to have a sufficient thickness, and a crack or the like can be prevented from occurring in the conductive adhesive 5. Since the first abutment body 260 pushes the second substrate 21 toward one side, it is configured such that a gap is hardly provided between the second-substrate-side abutment part 262 and the second conductor layer 22. In this respect, the crack can be prevented from occurring in the conductive adhesive 5 by providing the first convex part 265 as in the present embodiment even when adopting the aspect in which the conductive adhesive 5 is provided between the second conductor layer 22 and the second-substrate-side abutment part 262.

The first convex part 265 may have a semi-spherical or arcuate longitudinal cross section as illustrated in FIG. 4(a), or may have a trapezoidal longitudinal cross section as illustrated in FIG. 4(b). In addition, the invention is not limited thereto, and the longitudinal cross section of the first convex part 265 may be a rectangular shape or a triangular shape.

In addition, at least a part of the first convex part 265 may abut on the second conductor layer 22 as illustrated in FIG. 4(a), or the first convex part 265 may not abut on the second conductor layer 22 as illustrated in FIG. 4(b).

Third Embodiment

Next, a third embodiment of the present invention will be described.

Figure 5:
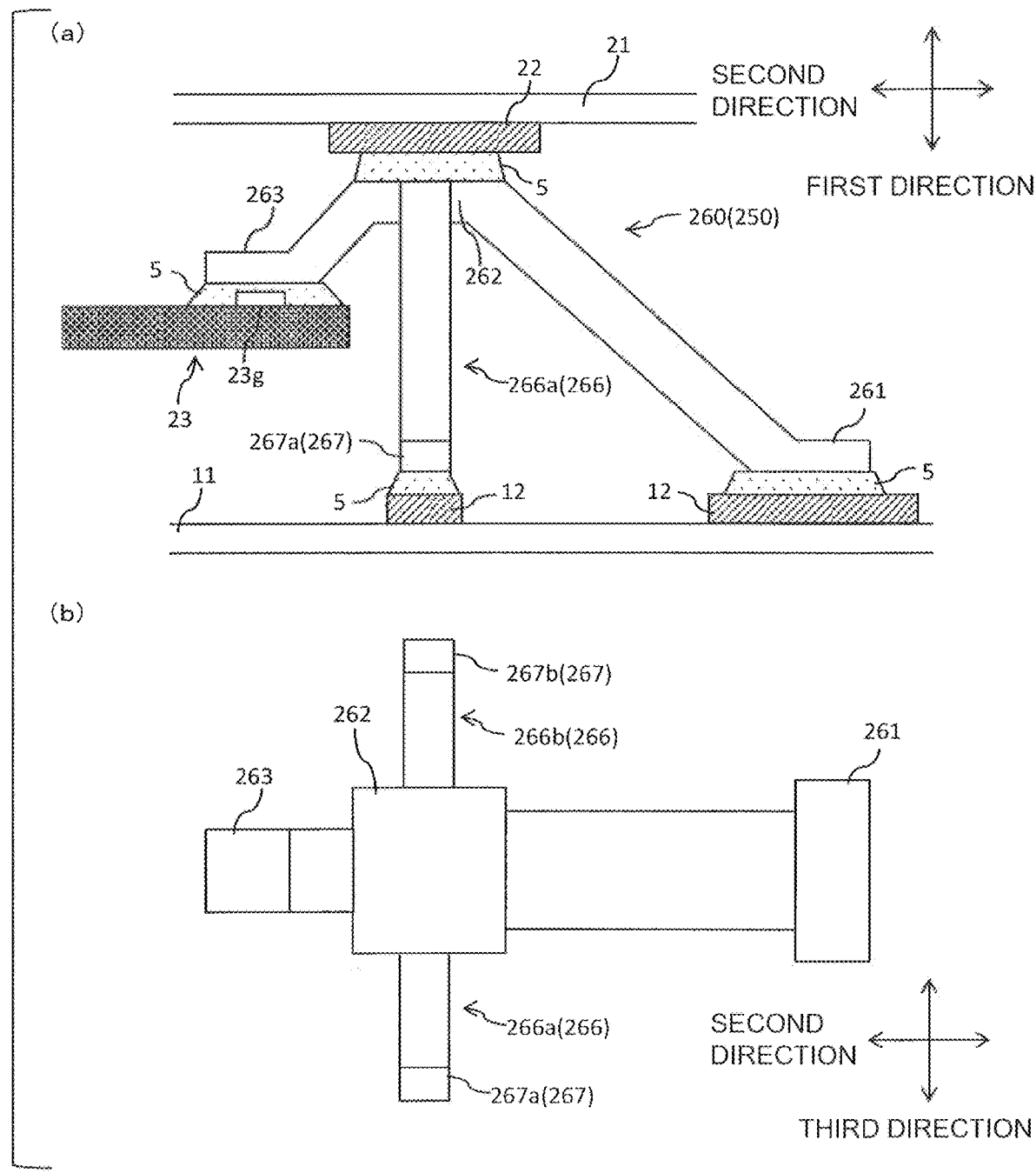
FIG. 5(a) is a longitudinal sectional view of a first abutment body that can be used in a third embodiment of the present invention.
FIG. 5(b) is a plan view of the first abutment body illustrated in FIG. 5(a).

The present embodiment is configured as an aspect in which one or more leg parts 266 (266a and 266b) extending to the other side are provided and the leg parts 266 abut on the first conductor layer 12 or the first substrate 11 as illustrated in FIG. 5. Although the present embodiment is described using the aspect in which the two leg parts 266 extending from the second-substrate-side abutment part 262, more particularly, the first leg part 266a and the second leg part 266b are provided as an example, the invention is not limited thereto. Only one leg part 266 may be provided, or three or more leg parts 266 may be provided. As for the other configurations, all the aspects that have been described in the above-described respective embodiments can be adopted. The members that have been described in the above-described respective embodiments will be described using the same reference signs.

When adopting the leg part 266 as in the present embodiment, it is advantageous in terms that the force toward one side can be imparted with respect to the second substrate 21 while receiving support from the first substrate 11 side using the leg part 266.

The aspect illustrated in FIG. 5 is an aspect in which the pair of leg parts 266 extend from both sides of the second-substrate-side abutment part 262. When adopting such a pair of leg parts 266, it is advantageous in terms that the force toward one side can be imparted with respect to the second substrate 21 while receiving support from the first substrate 11 side in a balanced manner. Incidentally, the leg part 266 does not need to extend from the second-substrate-side abutment part 262, and for example, the leg part 266 may extend from the first-substrate-side abutment part 261.

In particular, when adopting an aspect in which the pair of leg parts 266 extend in a direction (third direction) orthogonal to a direction (second direction) in which the abutment proximal end part 263, the second-substrate-side abutment part 262 and the first-substrate-side abutment part 261 extend as illustrated in FIG. 5(b), it is advantageous in terms that the second-substrate-side abutment part 262 can be supported from all directions of the abutment proximal end part 263, the first-substrate-side abutment part 261, and the pair of leg parts 266, and the force toward one side can be imparted with respect to the second substrate 21 while receiving support from the first substrate 11 side in a more balanced manner.

When adopting the aspect in which first conductor layer 12 abutting on the leg part 266 is not electrically connected to the other second conductor layer 22, the first conductor layer 12, the first electronic element 13, and the second electronic element 23 not to perform an electrical function, it is advantageous in terms that the first electronic element 13 and the second electronic element 23 can be prevented from exhibiting unexpected behavior due to conduction of the leg part 266.

The area of leg abutment parts 267 (267a and 267b) where the leg parts 266 abut on the first conductor layer 12 or the first substrate 11 may be smaller than the area of abutment of the first-substrate-side abutment part 261 on the first conductor layer 12 or the first substrate 11. When the leg part 266 as in the present embodiment is provided, the first substrate 11 needs to have a space for providing the leg part 266 or the first conductor layer 12 in which the leg part 266 is provided. When adopting this aspect, it is advantageous in terms that the area of abutment of the leg part 266 on the first conductor layer 12 or the first substrate 11 can be reduced.

Incidentally, the invention is not limited to such an aspect, and the area of the leg abutment parts 267 (267a and 267b) where the leg parts 266 abut on the first conductor layer 12 or the first substrate 11 may be set to be larger than the area of abutment of the first-substrate-side abutment part 261 on the first conductor layer 12 or the first substrate 11. In addition, the area of the leg abutment parts 267 where some of the leg parts 266 among the plurality of leg parts 266 abut on the first conductor layer 12 or the first substrate 11 may be larger than the area of abutment of the first-substrate-side abutment part 261 on the first conductor layer 12 or the first substrate 11, and the area of the leg abutment parts 267 where the remaining leg parts 266 abut on the first conductor layer 12 or the first substrate 11 may be smaller than the area of abutment of the first-substrate-side abutment part 261 on the first conductor layer 12 or the first substrate 11. In addition, the area of the leg abutment part 267 where the leg part 266 abuts on the first conductor layer 12 or the first substrate 11 may be the same size as the area of abutment of the first-substrate-side abutment part 261 on the first conductor layer 12 or the first substrate 11.

Fourth Embodiment

Next, a fourth embodiment of the present invention will be described.

Figure 6:
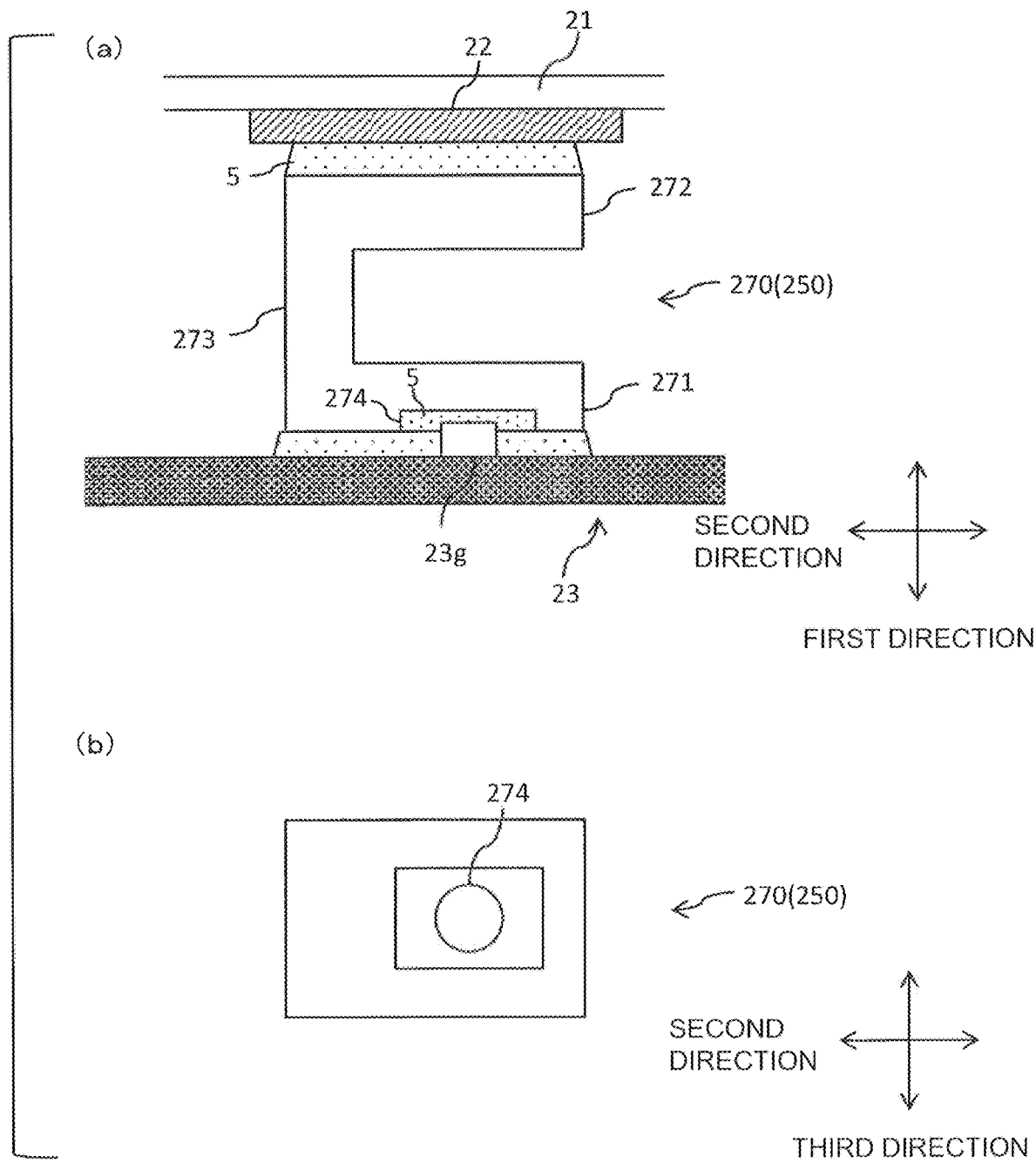
FIG. 6(a) is a longitudinal sectional view of a second abutment body that can be used in a fourth embodiment of the present invention.
FIG. 6(b) is a bottom view of the second abutment body illustrated in FIG. 6(a).

The description has been given using the first abutment body 260 in the above-described respective embodiments. In the present embodiment, a description will be given using an aspect in which a second abutment body 270 is adopted. As illustrated in FIG. 6, the second abutment body 270 has a first abutting member 271 abutting on a face on one side of the second electronic element 23, a second abutting member 272 provided on one side of the first abutting member 271, and a connecting member 273 that connects the first abutting member 271 and the second abutting member 272 and can impart a force toward one side with respect to the second abutting member 272. As for the other configurations, all the aspects that have been described in the above-described respective embodiments can be adopted. The members that have been described in the above-described respective embodiments will be described using the same reference signs.

When adopting the second abutment body 270 as in the present embodiment, the force toward one side can be imparted with respect to the second substrate 21 using the second abutting member 272 with a biasing force generated by the connecting member 273 while receiving support from the second electronic element 23 and the first abutting member 271, and the second substrate 21 can be prevented from bending toward the other side.

The first abutting member 271 may abut on a face on one side of the second electronic element 23 via the conductive adhesive 5 or the like. The second abutting member 272 may abut on the second conductor layer 22 via the conductive adhesive 5 or the like. When adopting such an aspect, a positional shift of the second abutment body 270 can be prevented by the conductive adhesive 5. In particular, although the force to warp or distort the first substrate 11 and the second substrate 21 is applied as the heat is applied, it is advantageous in terms that the positional shift of the second abutment body 270 can be prevented at this time.

The second abutment body 270 may be provided instead of the first abutment body 260. When the second electronic element 23 is a switching element such as a MOSFET and the second gate terminal 23g is provided, the first abutting member 271 of the second abutment body 270 may be electrically conductive to the second gate terminal 23g via the conductive adhesive 5 such that second conductor layer 22 connected to the second abutment body 270 is connected to the terminal part 110. When adopting such an aspect, it is advantageous in terms that the second abutment body 270 can also be used as a connection body for connecting the second electronic element 23 and the terminal part 110, and the first substrate 11 and the second substrate 21 can be prevented from being warped or distorted without increasing the number of parts.

As illustrated in FIG. 6, the second abutting member 272 may have an abutment concave part 274, which is configured to cover a circumference of the second gate terminal 23g and cover the conductive adhesive 5 such as solder provided on the second gate terminal 23g, on a bottom face (face on the other side). When adopting the above-described abutment concave part 274, it is advantageous in terms that the second abutment body 270 can be positioned with respect to the second gate terminal 23g. If such positioning is taken into consideration, an aspect in which a size of the abutment concave part 274 in the plane direction is slightly larger than the second gate terminal 23g (for example, by 1 to 3 mm) may be provided.

In this manner, the second abutment body 270 does not need to adopt an electrically meaningful aspect, and an aspect in which the second conductor layer 22 on which second abutting member 272 abuts is not electrically connected to the other second conductor layer 22, the first conductor layer 12, the first electronic element 13, and the second electronic element 23 not to perform an electrical function can be also adopted.

Fifth Embodiment

Next, a fifth embodiment of the present invention will be described.

Figure 7:
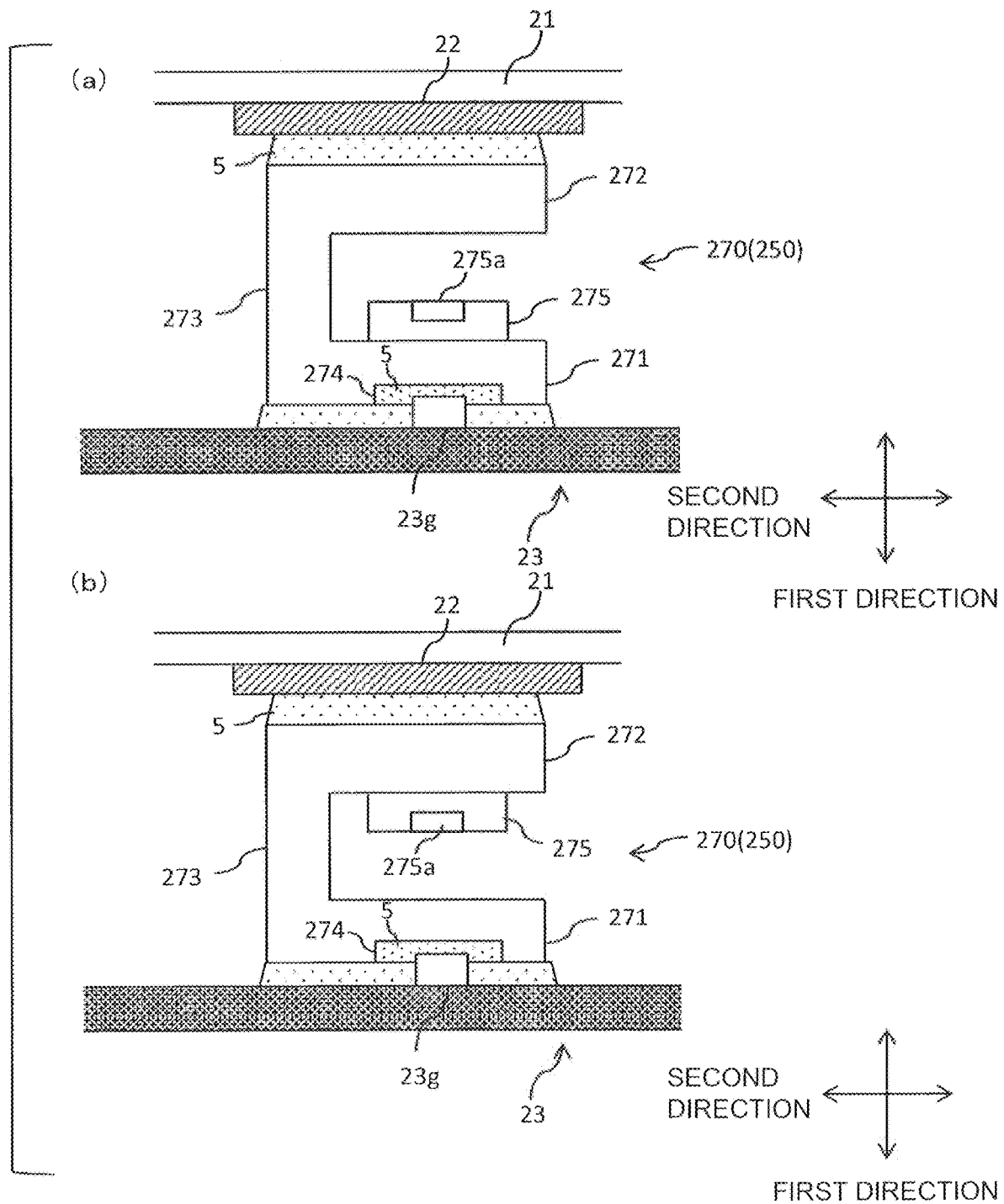
FIG. 7(a) is a longitudinal sectional view of a first abutment body that can be used in a fifth embodiment of the present invention.
FIG. 7(b) is a longitudinal sectional view of another first abutment body that can be used in the fifth embodiment of the present invention.

The present embodiment is configured as an aspect in which a protruding body 275 protruding to one side is provided on a face on one side of the first abutting member 271 as illustrated in FIG. 7(a) or as an aspect in which a protruding body 275 protruding to the other side is provided on a face on the other side of the second abutting member 272 as illustrated in FIG. 7(b). The other configurations are the same as those in the fourth embodiment. As for the other configurations, all the aspects that have been described in the above-described respective embodiments can be adopted. The members that have been described in the above-described respective embodiments will be described using the same reference signs. Incidentally, the protruding body 275 may be provided on each of the face on one side of the first abutting member 271 and the face on the other side of the second abutting member 272.

Even when warpage or distortion of the first substrate 11 and the second substrate 21 increases, the first substrate 11 and the second substrate 21 can be prevented from being warped or distorted beyond a certain value by providing the protruding body 275 as in the present embodiment. That is, since the protruding body 275 as in the present embodiment is provided, it is advantageous in terms that the second abutting member 272 abuts on the protruding body 275 even if the warpage or distortion of the first substrate 11 and the second substrate 21 increases so that the first substrate 11 or the second substrate 21 can be prevented from being warped or distorted further.

The protruding body 275 may have a protruding concave part 275a at the center thereof. When such a protruding concave part 275a is provided, it is advantageous in terms that the protruding part 275 can be recessed toward the protruding concave part 275a when an excessive force is applied and the second substrate 21 and the like can be prevented from being damaged by the excessive force.

Sixth Embodiment

Next, a sixth embodiment of the present invention will be described.

Figure 8:
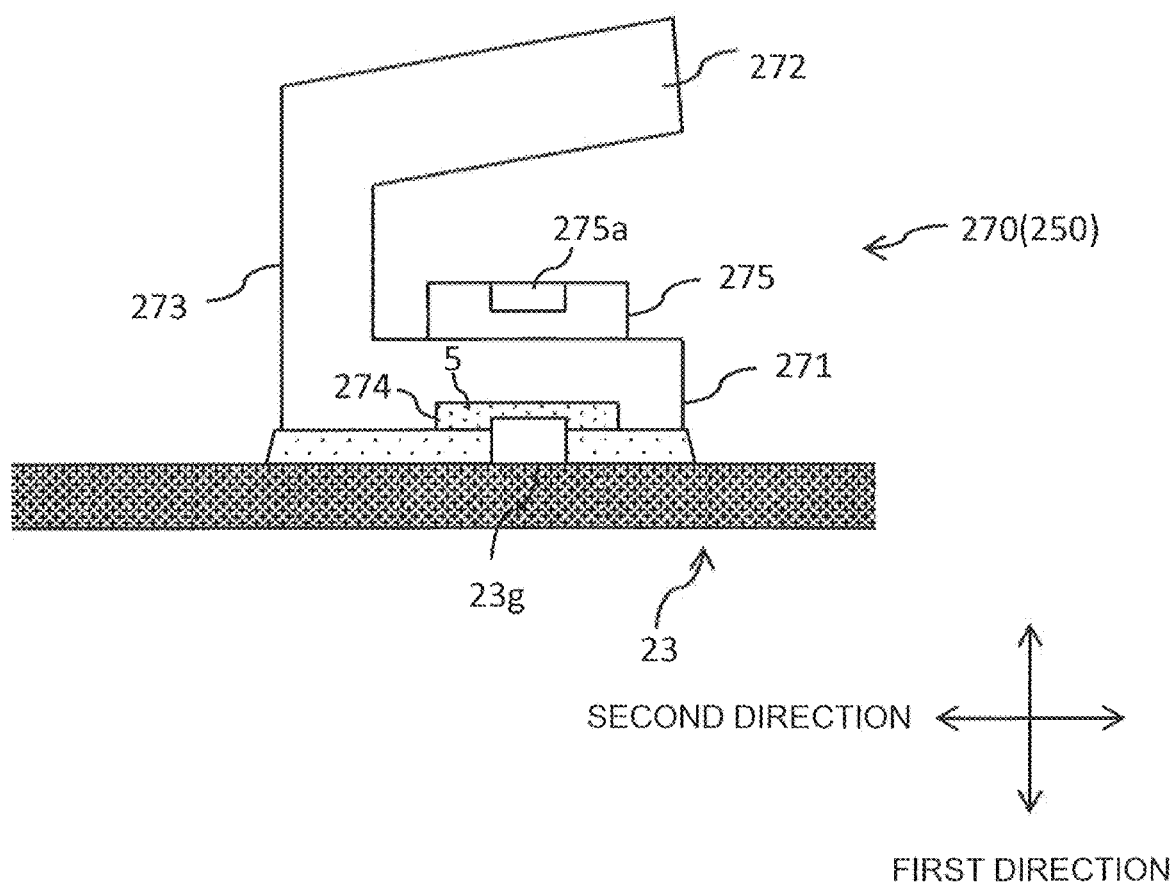
FIG. 8 is a longitudinal sectional view of a second abutment body that can be used in a sixth embodiment of the present invention.

In the present embodiment, the second abutting member 272 may be inclined to one side with respect to the plane direction as illustrated in FIG. 8. The other configurations are the same as those in the fifth embodiment. As for the other configurations, all the aspects that have been described in the above-described respective embodiments can be adopted. The members that have been described in the above-described respective embodiments will be described using the same reference signs.

When adopting the aspect in which the second abutting member 272 is inclined to one side with respect to the plane direction as in the present embodiment, it is advantageous in terms that the second substrate 21 can be more strongly pushed by the second abutting member 272. Incidentally, when the sealing resin to form the sealing part 90 is injected into a mold, the second substrate 21 is pressed from one side by the mold. Thus, even when adopting the aspect in which the second abutting member 272 is inclined toward one side with respect to the plane direction as illustrated in FIG. 8, the second abutting member 272 receives a force from the mold and extends in the plane direct on.

Seventh Embodiment

Next, a seventh embodiment of the present invention will be described.

Figure 9:
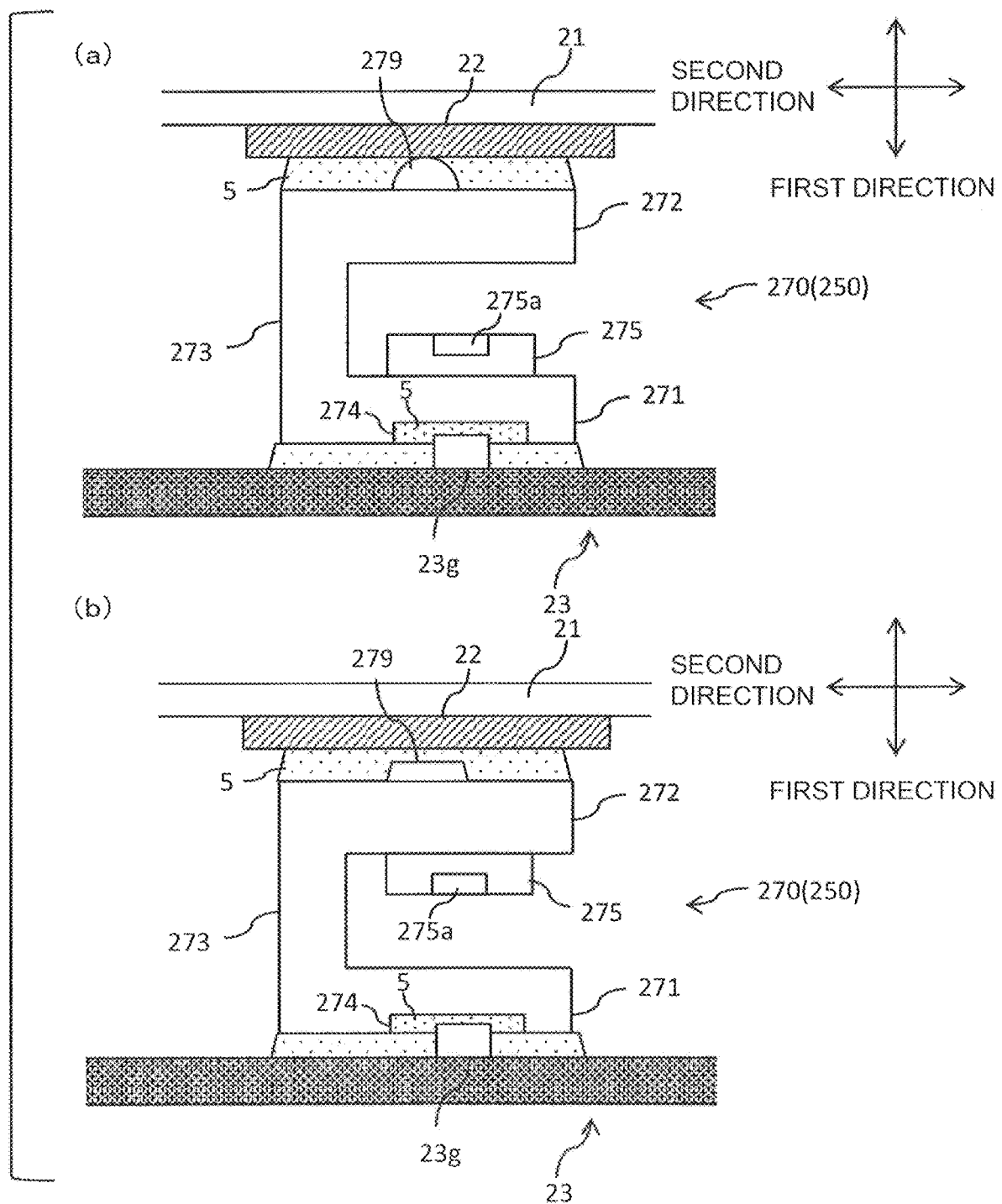
FIG. 9(a) is a longitudinal sectional view of a first abutment body that can be used in a seventh embodiment of the present invention.
FIG. 9(b) is a longitudinal sectional view of another first abutment body that can be used in the seventh embodiment of the present invention.

The present embodiment is configured as an aspect in which a second convex part 279 protruding toward one side is provided on the second abutting member 272 as illustrated in FIG. 9. The other configurations are the same as those in the fifth embodiment. All the aspects that have been described in the above-described respective embodiments can be adopted in the present embodiment. The members that have been described in the above-described respective embodiments will be described using the same reference signs.

When the second convex part 279 is provided on the second abutting member 272 as in the present embodiment, the conductive adhesive 5 provided between the second conductor layer 22 and the second abutting member 272 can be caused to have a sufficient thickness, and a crack or the like can be prevented from occurring in the conductive adhesive 5. Since the second abutment body 270 pushes the second substrate 21 toward one side, it is configured such that a gap is hardly provided between the second abutting member 272 and the second conductor layer 22. In this respect, the crack can be prevented from occurring in the conductive adhesive 5 by providing the second convex part 279 as in the present embodiment even when adopting the aspect in which the conductive adhesive 5 is provided between the second conductor layer 22 and the second abutting member 272.

The second convex part 279 may have a semi-spherical or arcuate longitudinal cross section as illustrated in FIG. 9(a), or may have a trapezoidal longitudinal cross section as illustrated in FIG. 9(b). In addition, the invention is not limited thereto, and the longitudinal cross section of the second convex part 279 may be a rectangular shape or a triangular shape.

Incidentally, the first abutment body 260 and the second abutment body 270 can be adopted at the same time. When adopting such an aspect, it is advantageous in terms that the first substrate 11 and the second substrate 21 can be prevented from being warped or distorted using the first abutment body 260, and the first substrate 11 and the second substrate 21 can be prevented from being warped or distorted using the second abutment body 270.

In addition, when adopting both the first abutment body 260 and the second abutment body 270, one of the first abutment body 260 and the second abutment body 270 is connected to the terminal such as the second gate terminal 23g, and the other may not have an electrical function without being connected to the terminal such as the second gate terminal 23g. Further, when the first abutment body 260 does not have the function as the terminal, the abutment proximal end part 263 of the first abutment body 260 may be provided at a location on the face on one side of the second electronic element 23 where a terminal or the like is not provided. When the second abutment body 270 does not have the function as the terminal, the first abutting member 271 of the second abutment body 270 may be provided at a location on the face on one side of the second electronic element 23 where a terminal or the like is not provided. Incidentally, both the first abutment body 260 and the second abutment body 270 may not have electrical functions without being connected to the terminal such as the second gate terminal 23g.

Eighth Embodiment

Next, an eighth embodiment of the present invention will be described.

Figure 10:
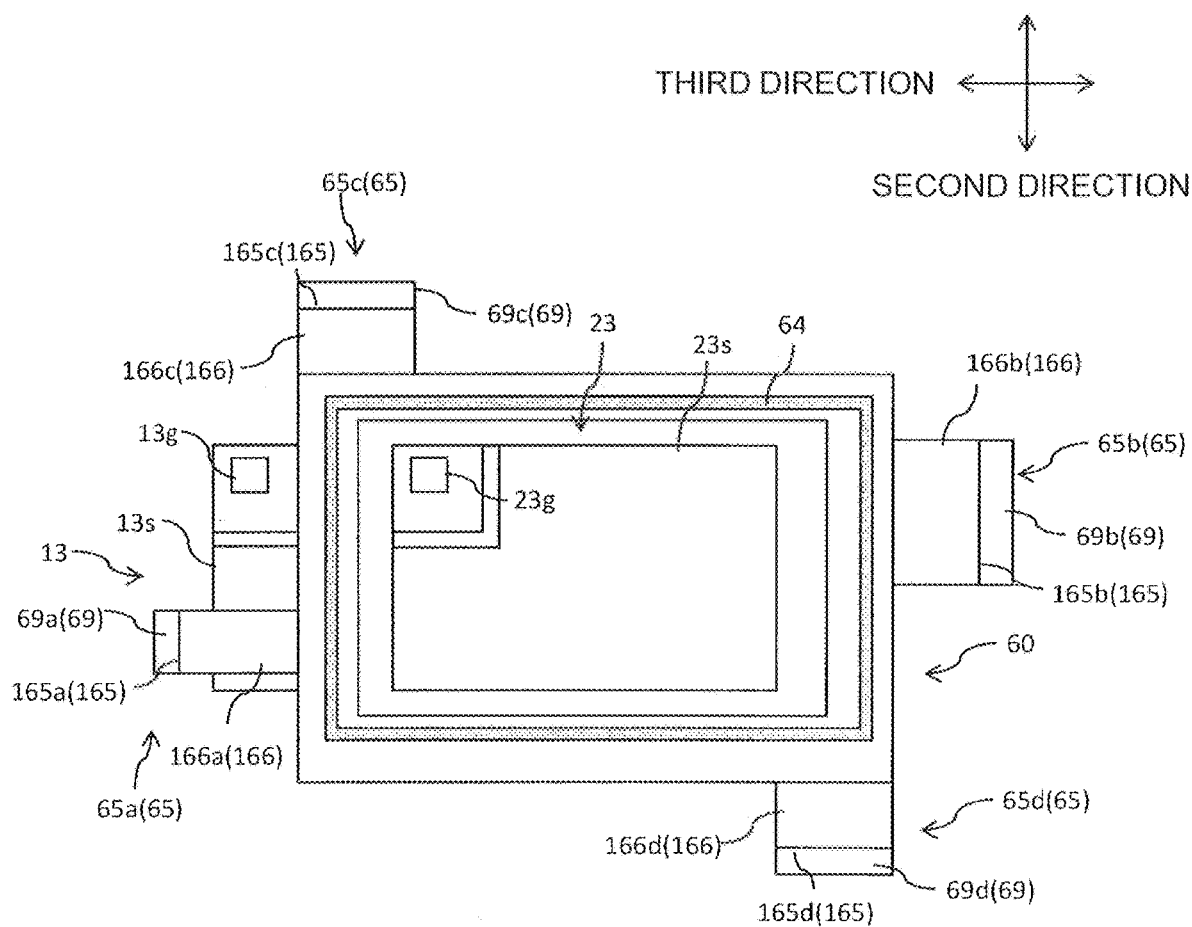
FIG. 10 is a plan view of an electronic module that can be used in an eighth embodiment of the present invention.

Although the first connection body 60 having the substantially T-shaped cross section has been used in the above-described respective embodiments, the first connection body 60 of the present embodiment has four support parts 65 (65a to 65d) extending from the first head part 61 to the other side as illustrated in FIG. 10. The support 65 is configured to abut on the first conductor layer or the first substrate. As for the other configurations, all the aspects that have been described in the above-described respective embodiments can be adopted. The members that have been described in the above-described respective embodiments will be described using the same reference signs.

Although the description is given using the aspect in which the four support parts 65 are used in the present embodiment, the invention is not limited thereto, and one, two, three, or five or more support parts 65 may be used.

When the support part 65 extending from the first head part 61 is provided as in the present embodiment, the first connection body 60 can be prevented from being inclined due to the weight of the second electronic element 23 at the time of mounting the second electronic element 23 or after mounting the second electronic element 23. In addition, since the support part 65 abuts on the first substrate 11 or the first conductor layer 12 in this manner, the heat dissipation can be enhanced. In particular, when the support part 65 abuts on the first conductor layer 12, it is advantageous in terms that the heat dissipation effect can be further enhanced.

In addition, when the plurality of support parts 65 are provided as in the present embodiment, it is advantageous in terms that the first connection body 60 can be more stably provided and a higher heat dissipation effect can be realized.

The support parts 65 may have support proximal end parts 69 (69a to 69d), respectively, extending in the plane direction and abutting on the first substrate 11 or the first conductor layer 12. In addition, it is not necessary to provide the support proximal end part 69 in each of the plurality of support parts 65, and the support proximal end part 69 may be provided in some of the plurality of support parts 65 and the support proximal end part 69 may not be provided in the other support parts 65.

When the above-described support proximal end part 69 is provided, the first connection body 60 can be arranged on the first substrate 11 or the first conductor layer 12 in a more balanced manner, and a contact area between the first connection body 60 and the first substrate 11 or the first conductor layer 12 can be increased by the support proximal end part 69 so that the heat dissipation effect can be enhanced.

As an example, each of the support parts 65 may abut on the first conductor layer 12. When adopting the aspect in which first conductor layer 12 connected to the support part 65 is not electrically connected to the other first conductor layer 12, the second conductor layer 22, the first electronic element 13, and the second electronic element 23 and does not perform an electrical function, it is advantageous in terms that the first electronic element 13 and the second electronic element 23 can be prevented from exhibiting unexpected behavior due to the conduction of the support part 65.

The respective support parts 65 may have plane-direction support parts 166 (166a to 166d) extending in the plane direction from the first head part 61 and height-direction support parts 165 (165a to 165d) extending in the height direction (first direction) from end parts of the plane-direction support parts 166 (see also a sixth embodiment to be described later). Incidentally, the plane-direction support part 166 means a part in which a length in the width direction is shorter than that of the first head part 61.

The support part 65 may have only the height-direction support part 165 extending in the height direction (first direction) from the first head part 61 without having the plane-direction support part 166.

It is advantageous to use the support part 65 as in the present embodiment when adopting the abutment body 250 that has been described in the above-described respective embodiments. The abutment body 250 is provided directly on the face on one side of the second electronic element 23 or indirectly via the conductive adhesive 5 and the like, and the second electronic element 23 as sometimes inclined at the time of pushing the second substrate 21 toward one side by the abutment body 250 unless the second electronic element 23 is arranged in a stable state. On the other hand, since the first connection body 60 has the support part 65 according to the present embodiment, the second electronic element 23 can be prevented from being inclined even when the second electronic element 23 is pressed to the other side by the abutment body 250. As a result, the second substrate 21 can be stably pushed toward one side by the abutment body 250.

In regard to the first abutment body 260, the abutment proximal end part 263 abuts on the face on one side of the second electronic element 23. When the first substrate 11 and the second substrate 21 are likely to be warped or distorted due to application of heat, a force is applied to the second electronic element 23 via the abutment proximal end part 263. In this respect, since the first connection body 60 has the support part 65 in the present embodiment, the second electronic element 23 can be prevented from being inclined. As a result, the second substrate 21 can be stably pushed toward one side by the first-substrate-side abutment part 261.

In regard to the second abutment body 270, the first abutting member 271 abuts on the face on one side of the second electronic element 23. When the first substrate 11 and the second substrate 21 are likely to be warped or distorted due to application of heat, a force is applied to the second electronic element 23 via the first abutting member 271. In this respect, since the first connection body 60 has the support part 65 in the present embodiment, the second electronic element 23 can be prevented from being inclined. As a result, the second substrate 21 can be stably pushed toward one side by the second abutting member 272.

Ninth Embodiment

Next, a ninth embodiment of the present invention will be described.

Figure 11:
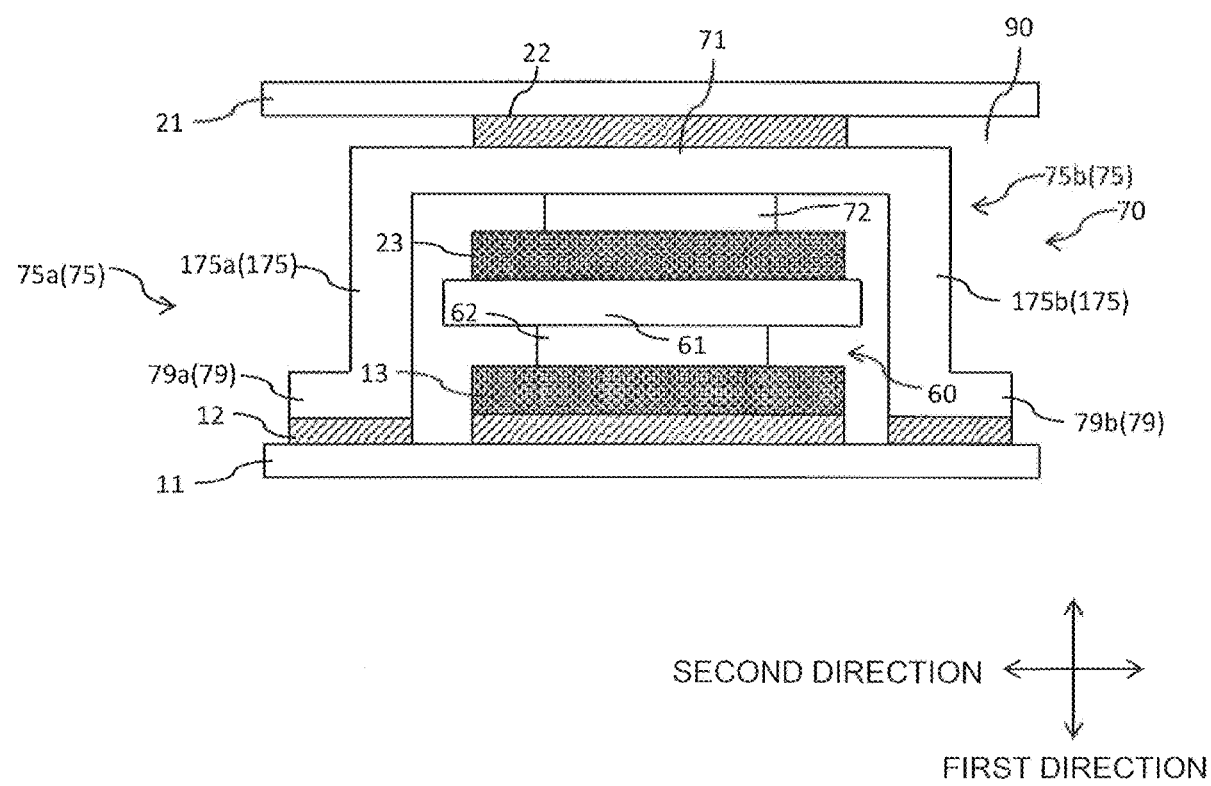
FIG. 11 is a longitudinal sectional view of an electronic module that can be used in a ninth embodiment of the present invention.

The description has been given using the second connection body 70 having the second pillar part 72 and having the substantially T-shaped cross section in the above-described respective Embodiments. In the present embodiment, however, the second connection body 70 has extending parts 75 (75a and 75b) extending from the second head part 71 to the other side as illustrated in FIG. 11. As for the other configurations, all the aspects that have been described in the above-described respective embodiments can be adopted. The members that have been described in the above-described respective embodiments will be described using the same reference signs.

Although the description is given using the aspect in which the two extending parts 75 are used in the present embodiment, the invention is not limited thereto, and one or three or more extending parts 75 may be used.

Since the extending part 75 is provided according to the present embodiment, heat from the second electronic element 23 can be efficiently dissipated, and a high heat dissipation effect can be also realized by the second connection body 70. In addition, when the plurality of extending parts 75 are provided as in the present embodiment, it is advantageous in terms that a higher heat dissipation effect can be realized.

Each of the extending parts 75 may abut on the first conductor layer 12. The first conductor layer 12 connected to the extending part 75 may not be electrically connected to the other first conductor layer 12 and the first electronic element 13.

The extending parts 75 may have extending proximal end parts 79 (79a and 79b), respectively, extending in the plane direction and abutting on the first substrate 11 or the first conductor layer 12. In addition, it is not necessary to provide the extending proximal end part 79 in each of the plurality of extending parts 75, and the extending proximal end part 79 may be provided in some of the plurality of extending parts 75 and the extending proximal end part 79 may not be provided in the other extending parts 75.

When the above-described extending proximal end part 79 is provided, the second connection body 70 can be arranged on the first substrate 11 or the first conductor layer 12 in a more balanced manner, and a contact area between the second connection body 70 and the first substrate 11 or the first conductor layer 12 can be increased by the extending proximal end part 79 so that the heat dissipation effect can be enhanced.

When adopting the second connection body 70 having the plurality of extending parts 75 as in the present embodiment, a repulsive force that pushes the second substrate 21 back to one side can be imparted similarly to the abutment body 250. That is, the force to warp or distort the first substrate 11 and the second substrate 21 is applied due to application of heat as described above. However, when using the second connection body 70 having the plurality of extending parts 75, it is advantageous in terms that the warpage or distortion of the first substrate 11 and the second substrate 21 can be prevented even by the second connection body 70 in addition to the action of the first abutment body 260 and the second abutment body 270.

Incidentally, the extending part 75 of the present embodiment has height-direction extending parts 175 (175a and 175b) extending from the second head part 71 in the height direction (first direction).

Tenth Embodiment

Next, a tenth embodiment of the present invention will be described.

Figure 12:
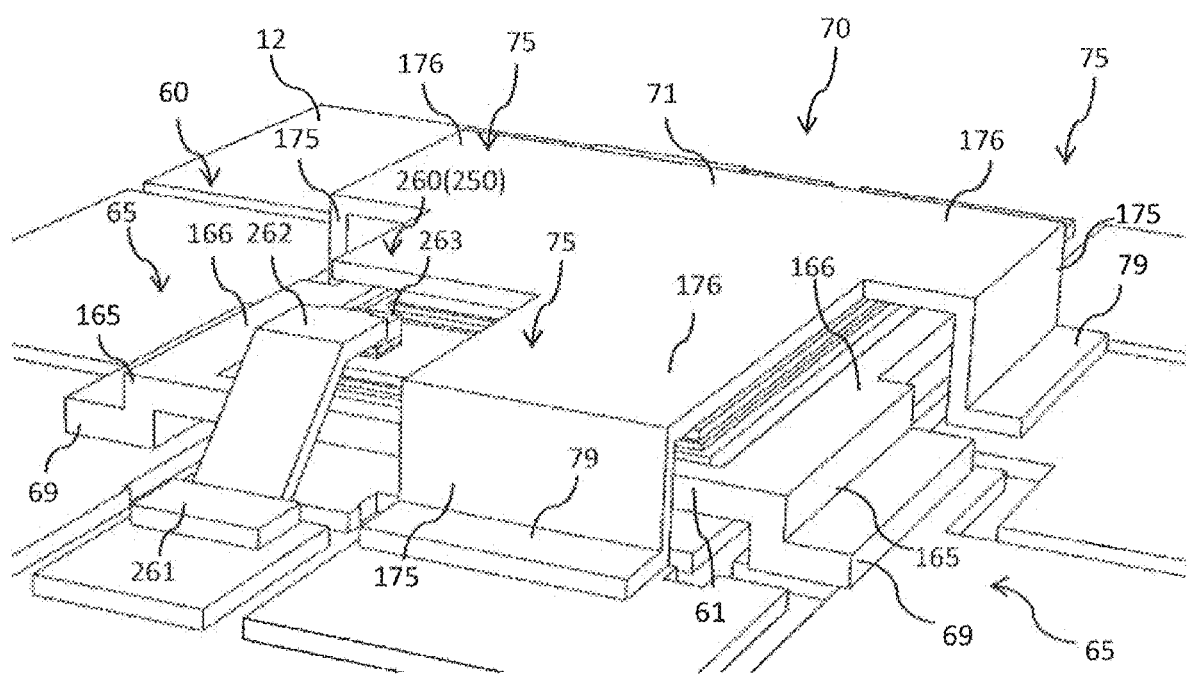
FIG. 12 is a perspective view of an electronic module that can be used in a tenth embodiment of the present invention.
Figure 13:
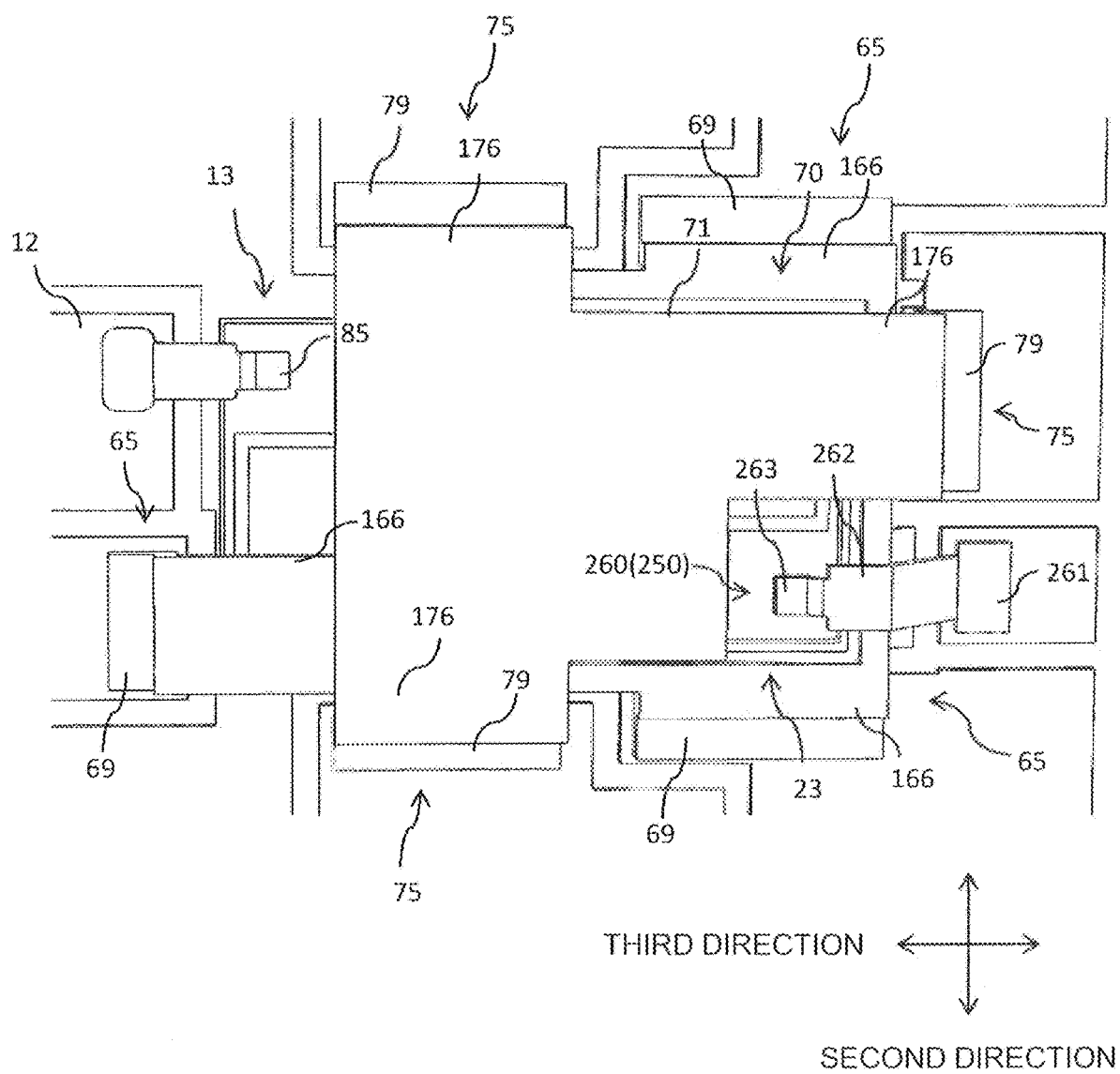
FIG. 13 is a plan view of the electronic module that can be used in the tenth embodiment of the present invention.
Figure 14:
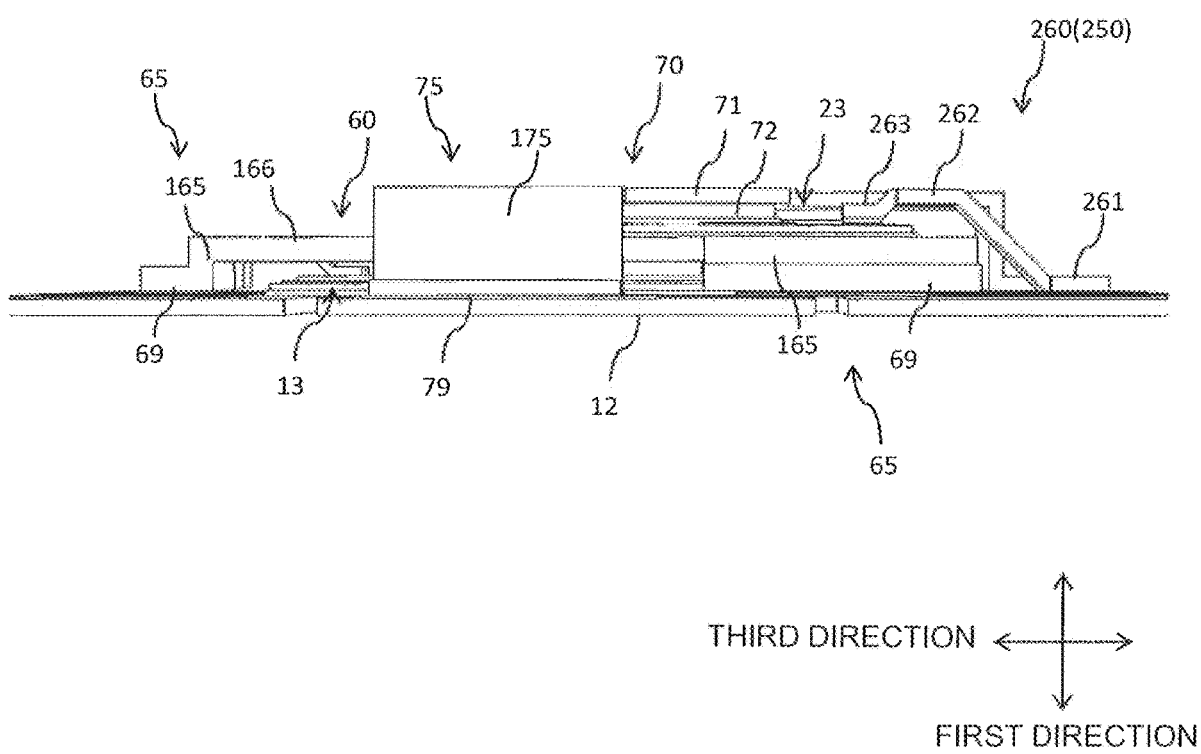
FIG. 14 is a side view of the electronic module that can be used in the tenth embodiment of the present invention.

Although the aspects in which the support part 65 is provided in the eighth embodiment, and the extending part 75 is provided in the ninth embodiment have been provided, both the support part 65 and the extending part 75 may be adopted together. In the present embodiment, a description will be given by exemplifying an aspect in which three support parts 65 and three extending parts 75 are used as illustrated in FIGS. 12 to 14. As for the other configurations, all the aspects that have been described in the above-described respective embodiments can be adopted. The members that have been described in the above-described respective embodiments will be described using the same reference signs.

As illustrated in the present embodiment, the extending part 75 may have the plane-direction extending part 176 extending in the plane direction from the second head part 71 and the height-direction extending part 175 extending in the height direction (first direction) from the plane-direction extending part 176. Incidentally, the plane-direction extending part 176 means a part whose size in the width direction is smaller than that of the second head part 71.

According to the present embodiment, it is advantageous in terms that the effect obtained by having the abutment body 250, the effect obtained by having the plurality of support parts 65 described above, and the effect obtained by having the plurality of extending parts 75 can be achieved.

The descriptions of the respective embodiments and the disclosure of the drawings described above are merely examples for describing the invention described in the claims, and the invention described in the claims is not limited by the descriptions of the embodiments or the disclosure of the drawings described above. In addition, the descriptions of the claims at the beginning of the application are merely examples, and the descriptions of the claims can be also appropriately changed based on the descriptions of the specification, the drawings, and the like.

REFERENCE SIGNS LIST

11 first substrate
12 first conductor layer
13 first electronic element
21 second substrate
22 second conductor layer
23 second electronic element
60 first connection body
250 abutment body
260 first abutment body
261 first-substrate-side abutment part
262 second-substrate-side abutment part
263 abutment proximal end part
265 first convex part
266 leg part
267 leg abutment part
270 second abutment body
271 first abutting member
272 second abutting member
273 connecting member

The invention claimed is:
1. An electronic module comprising:
a first substrate;
a first conductor layer provided on one side of the first substrate;

a first electronic element provided on one side of the first conductor layer;
a first connection body, being different from adhesive, provided on one side of the first electronic element and having a first head part and a first pillar part extending from the first head part to the other side;
a second electronic element provided on one side of the first connection body;
a second substrate provided on one side of the second electronic element and being a flat plate larger than the first electronic element and the second electronic element in plane;
a second conductor layer provided on the other side of the second substrate; and
an abutment body that has an abutment proximal end part that abuts on a face on one side of the second electronic element, a second-substrate-side abutment part that extends from the abutment proximal end part toward one side and abuts directly on the second conductor layer or the second substrate, and a first-substrate-side abutment part that extends from the second-substrate-side abutment part to the other side and abuts on the first conductor layer or the first substrate, and is capable of imparting a force toward one side with respect to the second substrate,
wherein the abutment body electrically connects the second electronic element and a terminal part which is connectable to an external device.

2. An electronic module comprising:
a first substrate that is a metal substrate;
a first electronic element provided on one side of the first substrate;
a first connection body, being different from adhesive, provided on one side of the first electronic element and having a first head part and a first pillar part extending from the first head part to the other side;
a second electronic element provided on one side of the first connection body;
a second substrate provided on one side of the second electronic element, and being a metal substrate and being a metal substrate being a flat plate larger than the first electronic element and the second electronic element in plane; and
an abutment body that has an abutment proximal end part that abuts on a face on one side of the second electronic element, a second-substrate-side abutment part that extends from the abutment proximal end part toward one side and abuts directly on the second substrate, and a first-substrate-side abutment part that extends from the second-substrate-side abutment part to the other side and abuts on the first substrate, and is capable of imparting a force toward one side with respect to the second substrate,
wherein the abutment body electrically connects the second electronic element and a terminal part which is connectable to an external device.

3. The electronic module according to claim 1, wherein
the second-substrate-side abutment part has a first convex part protruding to one side, and
the second-substrate-side abutment part abuts on the second conductor layer or the second substrate via conductive adhesive.

4. The electronic module according to claim 1, wherein
the abutment body has a plurality of leg parts extending to the other side in addition to the first-substrate-side abutment part; and
the plurality of leg parts are configured to abut on the first conductor layer or the first substrate.

5. The electronic module according to claim 4, wherein
an area where the plurality of leg parts abut on the first conductor layer or the first substrate is smaller than an area of the first-substrate-side abutment part abuts on the first conductor layer or the first substrate.

* * * * *